United States Patent
Wada

(10) Patent No.: US 9,598,633 B2
(45) Date of Patent: Mar. 21, 2017

(54) LUMINESCENT COLOR CONVERSION MEMBER AND LIGHT EMITTING DEVICE

(71) Applicant: TOYODA GOSEI CO., LTD., Kiyosu-shi (JP)

(72) Inventor: Satoshi Wada, Kiyosu (JP)

(73) Assignee: TOYODA GOSEI CO., LTD., Kiyosu-shi, Aichi-ken (JP)

( * ) Notice: Subject to any disclaimer, the term of this patent is extended or adjusted under 35 U.S.C. 154(b) by 168 days.

(21) Appl. No.: 14/631,754

(22) Filed: Feb. 25, 2015

(65) Prior Publication Data

US 2015/0275073 A1 Oct. 1, 2015

(30) Foreign Application Priority Data

Mar. 28, 2014 (JP) ................. 2014-069535

(51) Int. Cl.
| | |
|---|---|
| H01L 33/50 | (2010.01) |
| C09K 11/08 | (2006.01) |
| C09K 11/02 | (2006.01) |
| H01L 25/075 | (2006.01) |
| H01L 33/54 | (2010.01) |

(52) U.S. Cl.
CPC .......... *C09K 11/02* (2013.01); *H01L 25/0753* (2013.01); *H01L 33/54* (2013.01); *H01L 2924/0002* (2013.01); *H01L 2933/005* (2013.01)

(58) Field of Classification Search
CPC ........ C09K 11/02; F21K 99/00; H01L 33/502
See application file for complete search history.

(56) References Cited

U.S. PATENT DOCUMENTS

| | | | | |
|---|---|---|---|---|
| 7,989,236 | B2 * | 8/2011 | Yamaguchi | ........... C03B 19/063 257/100 |
| 8,173,043 | B2 * | 5/2012 | Iwao | ....................... C03B 19/06 252/301.4 F |
| 2008/0180018 | A1 * | 7/2008 | Minamoto | ............ C03C 14/006 313/483 |
| 2008/0187746 | A1 | 8/2008 | De Graaf et al. | |

FOREIGN PATENT DOCUMENTS

| | | |
|---|---|---|
| JP | 2008-060428 A | 3/2008 |
| JP | 2008-533270 A | 8/2008 |
| JP | 2010-083704 A | 4/2010 |
| JP | 2010-272894 A | 12/2010 |
| JP | 2013-030536 A | 2/2013 |
| JP | 5257854 B * | 5/2013 |
| JP | 5257854 B2 | 8/2013 |

* cited by examiner

*Primary Examiner* — Carol M Koslow

(74) *Attorney, Agent, or Firm* — McGinn IP Law Group, PLLC

(57) ABSTRACT

A luminescent color conversion member of a light emitting device includes a glass and integrated particles dispersed inside the glass, each of the integrated particles being a mixture of phosphors and a dispersively binding material that are bonded to each other. The luminescent color conversion member is configured as a sintered body of a mixture of the integrated particles and glass particles. The dispersively binding material is a non-glass material having transparency and bondability to the phosphors.

7 Claims, 3 Drawing Sheets ized color conversion member and light emitting device

CROSS-REFERENCE TO RELATED APPLICATIONS

The present application claims priority from Japanese Patent Application No. 2014-069535 filed on Mar. 28, 2014, the entire content of which is incorporated herein by reference.

FIELD OF INVENTION

The present invention relates to a luminescent color conversion member for converting a color of light emitted by a light emitting element and to a light emitting device using the luminescent color conversion member.

RELATED ART

According to a first related art, a luminescent color conversion member is configured such that inorganic phosphors are dispersed in a glass, the luminescent color conversion member being made of a sintered body of a mixture of glass powders and inorganic phosphor powders (see, e.g., JP 5257854 B2).

According to a second related art, phosphors are embedded in a ceramic matrix having a non-luminescent polycrystalline alumina, the phosphors having a polycrystalline ceramic structure including a doped YAG type phosphor (see, e.g., JP 2008-533270 A).

In the first related art, in order to obtain a uniform chromaticity distribution by the luminescent color conversion member, it is necessary to produce a state where a plurality of phosphors are distributed to be overlapped in a thickness direction of the luminescent color conversion member by reducing the particle size of the phosphor powder and uniformly and densely dispersing the phosphor powder inside the luminescent color conversion member.

In a light emitting device including the luminescent color conversion member and a light emitting element, primary light (blue light) is excitation light emitted by the light emitting element, and the phosphors contained in the luminescent color conversion member (wavelength conversion member) is excited by a portion of the primary light to generate luminescent color-converted (wavelength-converted) secondary light (yellow light). The primary light and the secondary light are mixed to generate a mixed-color light (white light). The mixed-color light is emitted outside from the light emitting device through the luminescent color conversion member.

Thus, light energy that is not converted during the luminescent color conversion becomes thermal energy to cause the phosphors to generate heat. Accordingly, the temperature of the phosphors is raised and the efficiency of the luminescent color conversion is lowered. Further, the components of the light emitting device are deteriorated due to the heat-generation. Accordingly, it is necessary to efficiently dissipate the heat generated by the phosphors. Therefore, when the luminescent color conversion member is thinly molded, heat is prevented from being confined in the luminescent color conversion member and the heat generated by the luminescent color conversion member is efficiently dissipated through a light emitting element adjacent to the luminescent color conversion member. As a result, the temperature rise of the luminescent color conversion member is suppressed and the efficiency decrease of the luminescent color conversion (wavelength conversion) is prevented. Further, the components of the light emitting device are prevented from being deteriorated by the heat generated by the luminescent color conversion member, so that it is possible to achieve higher output of the light emitting device.

Here, in a case in which the particle size of the phosphor powder is increased, the part of the interior of the luminescent color conversion member, in which the phosphor powder is not present, becomes larger when the luminescent color conversion member is thinly molded. Accordingly, it is not possible to obtain a uniform chromaticity distribution. Further, by producing a state where a plurality of phosphors are distributed to be overlapped in a thickness direction of the luminescent color conversion member, the scattering of light by at least one of the phosphor powder or the dispersively binding material occurs inside the luminescent color conversion member. Accordingly, it is possible to obtain more uniform chromaticity distribution.

In order to uniformly and densely disperse the phosphor powders inside the luminescent color conversion member, the glass powders and the phosphor powders need to be mixed uniformly. To this end, the particle sizes of the glass powder and the phosphor powder need to be substantially the same. In other words, the particle size of the phosphor powder is defined by the particle size of the glass powder.

However, when the particle size of the glass powder is reduced (e.g., less than 10 nm), it is difficult to separate the impurities mixed in the glass powder. Accordingly, the yield of the glass powder is reduced and thus the manufacturing cost of the glass powder is increased. Therefore, it is difficult to reduce the particle size of the glass powder and it is also difficult to reduce the particle size of the phosphor powder. Furthermore, since the association and aggregation of the phosphor powder is liable to occur when the particle size of the phosphor powder is reduced, it is difficult to uniformly mix the glass powders and the phosphor powders.

As described above, in the first related art, it is difficult to reduce the particle size of the phosphor powder and it is also difficult to uniformly and densely disperse the phosphor powder inside the luminescent color conversion member. Further, it is not possible to produce a state where phosphors are distributed to be overlapped in a thickness direction of the luminescent color conversion member. Accordingly, there is a problem that it is not possible to obtain a uniform chromaticity distribution by the luminescent color conversion member.

The second related art teaches to produce a light emitting device (light emitting element) by attaching the composite materials of ceramic matrix having the phosphors embedded therein on a light emitting diode in the form of a molding cup or attaching the composite materials to the top of the light emitting diode in the form of a flat plate. However, in the second related art, a glass containing a phosphor of a polycrystalline ceramic structure has not been suggested. In the second related art, the composite materials of ceramic matrix having the phosphors embedded therein are attached to the light emitting diode by using a sol-gel glass as an adhesive. However, this has no relation to the glass containing the phosphor of the polycrystalline ceramic structure.

SUMMARY

Illustrative aspects of the present invention provide a luminescent color conversion member that is capable of obtaining a uniform chromaticity distribution by reducing the particle size of the phosphors and also uniformly and densely dispersing the phosphors inside the luminescent color conversion member, and a light emitting device using the luminescent color conversion member.

According to an aspect of the present invention, a luminescent color conversion member includes a glass and integrated particles dispersed inside the glass, each of the integrated particles being a mixture of phosphors and a dispersively binding material that are bonded to each other. The luminescent color conversion member is configured as a sintered body of a mixture of the integrated particles and glass particles. The dispersively binding material is a non-glass material having transparency and bondability to the phosphors.

In the integrated particles, the phosphors are bonded in a state of being dispersed by the dispersively binding material. In other words, the dispersively binding material has a function of binding the phosphors and a function of dispersing the phosphors. Further, the glass particles have a function of binding the integrated particles and a function of dispersing the integrated particles.

Therefore, in the first aspect, by sufficiently increasing the particle size of the integrated particles and then causing the particle size of the integrated particles to be substantially the same as the particle size of the glass particles, it is possible to uniformly mix the integrated particles and the glass particles even when the particle size of the phosphors is reduced. That is, the particle size of the phosphors is not defined by the particle size of the glass particles and the particle size of the integrated particles is defined by the particle size of the glass particles. Accordingly, it is possible to sufficiently increase the particle size of the glass particles and it is easy to separate the impurities mixed in the glass particles. As a result, the yield of the glass particles is improved and it is possible to reduce the manufacturing cost of the glass particles.

Further, by reducing the particle size of the phosphors, the part of the interior of the luminescent color conversion member, in which the phosphors are not present, becomes extremely small even when the luminescent color conversion member is thinly molded. Accordingly, it is possible to obtain a uniform chromaticity distribution. Further, by reducing the particle size of the phosphors, it is possible to produce a state where a plurality of phosphors are distributed to be overlapped in a thickness direction of the luminescent color conversion member even when the luminescent color conversion member is thinly molded. Accordingly, the scattering of light by at least one of the phosphors or the dispersively binding material occurs inside the luminescent color conversion member, so that it is possible to obtain more uniform chromaticity distribution.

Therefore, the particle size of the phosphors is reduced, the phosphors are uniformly and densely dispersed inside the luminescent color conversion member and a state is obtained where a plurality of phosphors are distributed to be overlapped in a thickness direction of the luminescent color conversion member. Accordingly, it is possible to provide the luminescent color conversion member that is capable of obtaining a uniform chromaticity distribution. The integrated particle may be a particle obtained by the association and aggregation of the phosphor particles and the dispersively binding material particles, or a particle of a sintered body of the phosphors and the dispersively binding material.

The phosphors may be garnet-based phosphors and the dispersively binding material may be an alumina. With this configuration, it is possible to easily manufacture the luminescent color conversion member that is capable of reliably obtaining the advantageous effect of the first aspect. Further, the garnet-based phosphors contain aluminum oxide and thus the phosphors and the dispersively binding material have common constituent elements. Accordingly, it is possible to improve the binding property of the phosphors and the dispersively binding material. In addition, the refractive index difference between the phosphors and the dispersively binding material is small, so that it is possible to reduce light loss.

A particle size of the phosphors may be in a range of 1 nm to 7 nm. The particle size of the phosphors may be substantially equal to a particle size of the dispersively binding material. In a case in which the particle size of the phosphors is greater than the above range, the part of the interior of the luminescent color conversion member, in which the phosphors are not present, becomes larger when the luminescent color conversion member is thinly molded. Accordingly, it is not possible to obtain a uniform chromaticity distribution. In a case in which the particle size of the phosphors is less than the above range, the efficiency of the luminescent color conversion by the excitation of the phosphors is lowered. Accordingly, it is not possible to obtain a desired luminescent color. Further, because the particle size of the phosphors and the particle size of the dispersively binding material are made to be substantially the same, it is possible to uniformly mix and bond the phosphor particles and the dispersively binding material particles.

A particle size of the glass particles may be equal to or greater than 15 nm. A particle size of the integrated particles may be substantially equal to the particle size of the glass particles. In a case in which the particle size of the glass particles is less than the above range, it is difficult to separate the impurities mixed in the glass particles. Accordingly, the yield of the glass particles is reduced and thus the manufacturing cost of the glass particles is increased. Further, because the particle size of the integrated particles and the particle size of the glass particles are made to be substantially the same, it is possible to uniformly mix the integrated particles and the glass particles.

According to another aspect of the present invention, a light emitting device includes a light emitting element, and the luminescent color conversion member described above. The luminescent color conversion member is configured and arranged such that primary light and secondary light are mixed to generate a mixed color light and such that the mixed-color light is emitted outside from the luminescent color conversion member, the primary light being excitation light emitted by the light emitting element, and the secondary light being a portion of the primary light that has been color-converted by an excitation of the phosphors contained in the luminescent color conversion member.

Light energy that is not converted during the luminescent color conversion becomes thermal energy to cause the phosphors to generate heat. Accordingly, the temperature of the phosphors is raised and the efficiency of the luminescent color conversion is lowered. Further, the components of the light emitting device are deteriorated due to the heat-generation. Accordingly, in the fifth aspect, it is necessary to efficiently dissipate the heat generated by the phosphors. Therefore, when the luminescent color conversion member is thinly molded, heat is prevented from being confined in the luminescent color conversion member and the heat generated by the luminescent color conversion member is efficiently dissipated through a light emitting element adjacent to the luminescent color conversion member. As a result, the temperature rise of the luminescent color conversion member is suppressed and the efficiency decrease of the luminescent color conversion (wavelength conversion) is prevented. Further, the components of the light emitting device are prevented from being deteriorated by the heat generated by the luminescent color conversion member, so that it is possible to achieve higher output of the light emitting device.

According to one or more aspect of the present invention, it is possible to produce a state where a plurality of phosphors are distributed to be overlapped in a thickness direction of the luminescent color conversion member even when the luminescent color conversion member is thinly molded. Accordingly, the scattering of light by at least one of the phosphors or the dispersively binding material occurs inside the luminescent color conversion member, so that it is possible to obtain more uniform chromaticity distribution. Accordingly, with the luminescent color conversion member described above, it is possible to easily achieve both the higher output of the light emitting device and the uniform chromaticity distribution.

DETAILED DESCRIPTION

Figure 1A:
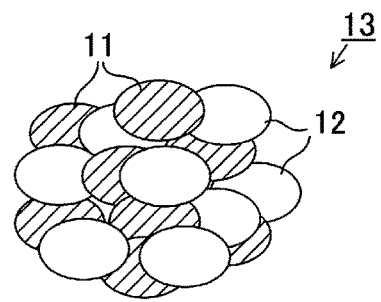
FIGS. 1A to 1C are schematic views for explaining a method of manufacturing a luminescent color conversion member according to an illustrative embodiment of the present invention.

Hereinafter, illustrative embodiments of the present invention will be described in detail with reference to the drawings. In the respective embodiments, same elements are denoted by same reference numerals, and repetitive description of common features will be omitted. In the drawings, for the purpose of simplifying the illustration, sizes, shapes and arrangements of the elements in the respective embodiments may not correspond to the actual sizes, shapes and arrangements of the elements, and may be schematically shown in an exaggerated manner.

Luminescent Color Conversion Member 10

As shown in FIG. 1A, integrated particles (luminescent color conversion particles) 13 are manufactured by mixing phosphors 11 and a dispersively binding material 12 and associating and aggregating the phosphors 11 and the dispersively binding material 12. As the phosphors 11, any one of a garnet-based phosphor (e.g., YAG phosphor, LuAG phosphor, TAG phosphor and the like), a SiAlON phosphor, a CASN phosphor, a fluoride-based phosphor and a BOS phosphor may be used. Among these, the garnet-based phosphor is preferred since it has a high thermal stability.

The dispersively binding material (binder) 12 may be any material (e.g., alumina) having transparency and bondability to the phosphors 11. However, it is preferable to use the materials having the same constituent element as the phosphors 11 so that the boding strength to the phosphors 11 is improved. Further, in this case, since the refractive index difference between the materials and the phosphors 11 is small, it is also possible to reduce light loss. When using the garnet-based phosphors as the phosphors 11, it is preferable to use alumina as the dispersively binding material 12 since the garnet-based phosphors contain aluminum oxide. Further, in order to associate and aggregate the phosphors 11 and the dispersively binding material 12, any methods may be used. For example, a method of simply mixing the phosphors 11 and the dispersively binding material 12, or a method of mixing the phosphors 11 and the dispersively binding material 12 in a proper solution to form a slurry and then removing the solution, a method of aggregating the phosphors 11 and the dispersively binding material 12 and then sintering them may be used.

In the case of YAG, a suitable particle size of the phosphors 11 is in a range of 1 μm to 7 μm, preferably in a range of 2 μm to 5 μm. In a case in which the particle size of the phosphors 11 is greater than the above range, the part of the interior of the luminescent color conversion member 10, in which the phosphors 11 are not present, becomes larger when the luminescent color conversion member 10 is thinly molded. Accordingly, it is not possible to obtain a uniform chromaticity distribution. In a case in which the particle size of the phosphors 11 is less than the above range, the efficiency of the luminescent color conversion by the excitation of the phosphors is lowered. Accordingly, it is not possible to obtain a desired luminescent color. Further, by causing the particle size of the dispersively binding material 12 to be substantially the same as the particle size of the phosphors 11, it is possible to uniformly mix and associate and aggregate the phosphors 11 and the dispersively binding material 12.

Figure 1B:
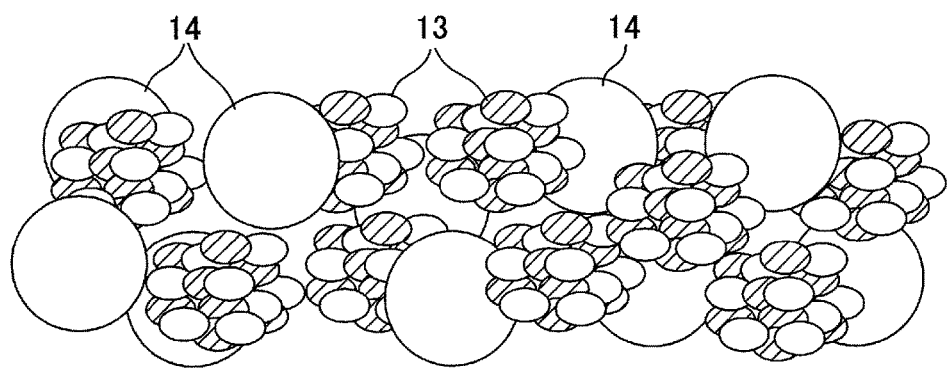

As shown in FIG. 1B, the integrated particles 13 and glass particles 14 having a low-melting point are mixed. A suitable particle size of the glass particles 14 is equal to or greater than 15 μm, preferably greater than 20 μm. In a case in which the particle size of the glass particles 14 is less than the above range, it is difficult to separate the impurities mixed in the glass particles 14. Accordingly, the yield of the glass particles 14 is reduced and thus the manufacturing cost of the glass particles 14 is increased. Further, by causing the particle size of the integrated particles 13 to be substantially the same as the particle size of the glass particles 14, it is possible to uniformly mix the integrated particles 13 and the glass particles 14.

Figure 1C:
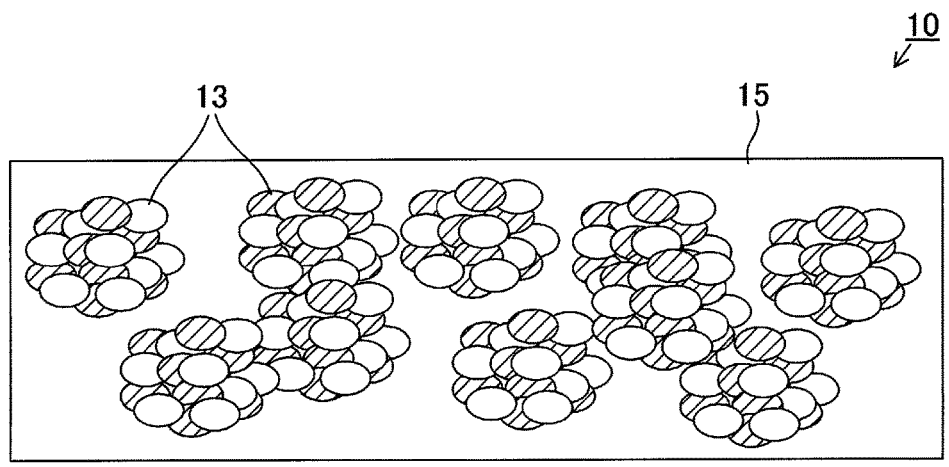

As shown in FIG. 1C, a mixture of the integrated particles 13 and the glass particles 14 are heated, the glass particles 14 are melted to form a melted glass and then the melted glass is cooled to form a glass 15. In this way, the luminescent color conversion member (wavelength conversion member) 10 is configured as a sintered body of a mixture of the integrated particles 13 and the glass particles 14, having the integrated particles 13 dispersed inside the glass 15.

Advantageous Effects of Luminescent Color Conversion Member 10

In the integrated particles 13, the phosphors 11 are bonded in a state of being dispersed by the dispersively binding material 12. In other words, the dispersively binding material 12 has a function of binding the phosphors 11 and a function of dispersing the phosphors 11. The glass particles 14 have a function of binding the integrated particles 13 and a function of dispersing the integrated particles 13.

Therefore, by sufficiently increasing the particle size of the integrated particles 13 and then causing the particle size of the integrated particles 13 to be substantially the same as the particle size of the glass particles 14, it is possible to uniformly mix the integrated particles 13 and the glass particles 14 even when the particle size of the phosphors 11 is reduced. That is, in the luminescent color conversion member 10, the particle size of the phosphors 11 is not defined by the particle size of the glass particles 14 and the particle size of the integrated particles 13 is defined by the particle size of the glass particles 14. Accordingly, it is possible to sufficiently increase the particle size of the glass particles 14 and it is easy to separate the impurities mixed in the glass particles 14. As a result, the yield of the glass particles 14 is improved and it is possible to reduce the manufacturing cost of the glass particles 14.

Further, by reducing the particle size of the phosphors 11, the part of the interior of the luminescent color conversion member 10, in which the phosphors 11 are not present, becomes extremely small even when the luminescent color conversion member 10 is thinly molded. Accordingly, it is possible to obtain a uniform chromaticity distribution. Further, by reducing the particle size of the phosphors 11, it is possible to produce a state where a plurality of phosphors 11 are distributed to be overlapped in a thickness direction of the luminescent color conversion member 10 even when the luminescent color conversion member 10 is thinly molded. Accordingly, the scattering of light by at least one of the phosphors 11 or the dispersively binding material 12 occurs inside the luminescent color conversion member 10, so that it is possible to obtain more uniform chromaticity distribution.

Accordingly, in the luminescent color conversion member 10, the particle size of the phosphors 11 is reduced, the phosphors 11 are uniformly and densely dispersed inside the luminescent color conversion member 10 and a state is obtained where a plurality of phosphors 11 are distributed to be overlapped in a thickness direction of the luminescent color conversion member 10. As a result, it is possible to obtain a uniform chromaticity distribution.

Light Emitting Device 20—First Embodiment

Figure 2:
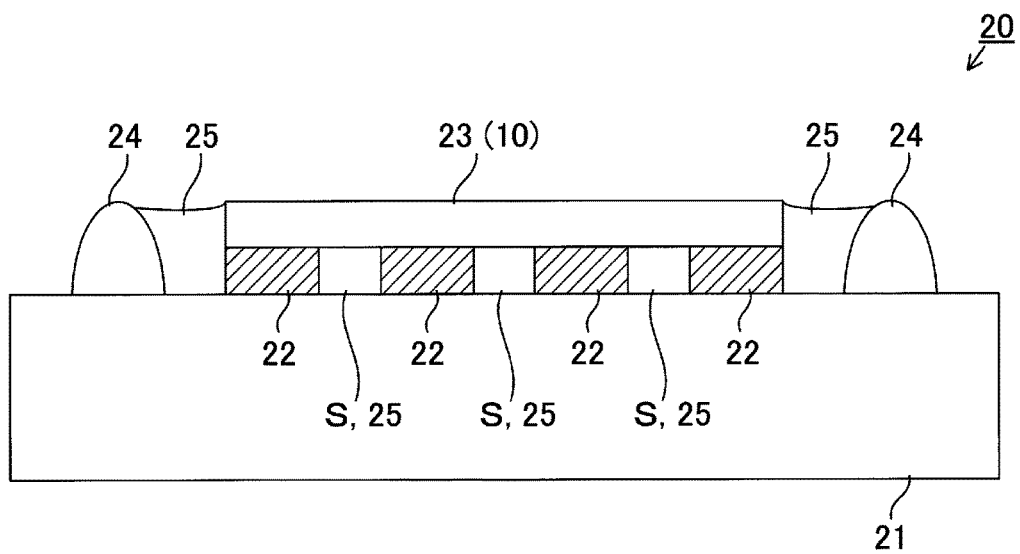
FIG. 2 is a longitudinal sectional view showing a schematic configuration of a light emitting device according to a first embodiment of the present invention.

As shown in FIG. 2, the light emitting device 20 of the first embodiment includes an insulating substrate 21, a light emitting diode (LED) chip 22, a phosphor plate 23 (the luminescent color conversion member 10), a frame 24, a reflective layer 25 and the like.

For example, the insulating substrate (mounting board) 21 is formed by a substrate made of a bulk material of an insulating material (e.g., ceramic material such as aluminum nitride, synthetic resin material and the like) or a substrate where an insulating layer is provided on a surface of a metallic material (e.g., aluminum alloy, pure copper, copper-based alloy and the like).

Four LED chips 22 are blue LEDs having a substantially rectangular parallelepiped shape and arranged in a row with a gap S therebetween. Bottom surfaces of each LED chip 22 are electrically connected and fixedly bonded to a wiring layer (not shown) formed on the surface of the insulating substrate 21 using various bonding methods (e.g., soldering, stud bump bonding, metallic fine particle bonding, surface activation bonding and the like). It should be noted that the LED chips 22 may be substituted with any semiconductor light emitting element (e.g., electroluminescent (EL) element).

The phosphor plate 23 is obtained by forming the luminescent color conversion member 10 into a flat plate. One phosphor plate 23 is attached and fixed to the upper surfaces of each LED chip 22 so as to cover the upper surfaces of four LED chips 22. Attaching and fixing of the phosphor plate 23 and each LED chip 22 may be performed using any methods. For example, a method of using an adhesive may be used. Alternatively, instead of using an adhesive, a method of heating and softening the luminescent color conversion member 10 and then urging and sticking the luminescent color conversion member 10 on the upper surfaces of each LED chip 22 may be used.

The frame 24 has a substantially rectangular frame shape, as seen in a plan view. The frame 24 is formed on the surface of the insulating substrate 21 so as to surround each LED chip 22 that is covered by the phosphor plate 23. The frame 24 is formed by a white synthetic resin material (e.g., silicone-based resin, epoxy-based resin and the like) containing fine particles of material (e.g., titanium oxide, aluminum oxide and the like) with high light reflectivity, a light-reflective ceramic material (e.g., aluminum oxide), a light-reflective metallic material (e.g., aluminum alloy). The frame 24 also functions as a reflector.

The reflective layer 25 surrounds each LED chip 22 and the phosphor plate 23. Further, the reflective layer 25 is filled into a space surrounded by outer peripheral surfaces of each LED chip 22, an outer peripheral end surface of the phosphor plate 23, a surface of the insulating substrate 21 exposed from each LED chip 22 and an inner peripheral wall surface of the frame 24. The reflective layer 25 is injected to the inside of the frame 24 so that the reflective layer seals each LED chip 22 and the phosphor plate 23 and is filled into the gaps S of each LED chip 22. The reflective layer 25 is formed by a white synthetic resin material (e.g., silicone-based resin, epoxy-based resin and the like) containing fine particles of material (e.g., titanium oxide, aluminum oxide and the like) with high light reflectivity.

Advantageous Effects of Light Emitting Device 20—First Embodiment

In the light emitting device 20, primary light (blue light) is excitation light emitted by the LED chips 22, and the phosphors (the phosphors 11) contained in the phosphor plate 23 (the luminescent color conversion member 10) are excited by a portion of the primary light to generate luminescent color-converted secondary light (yellow light). The primary light and the secondary light are mixed to generate a mixed-color light (white light). The mixed-color light is emitted outside from the light emitting device 20 through the phosphor plate 23.

Thus, light energy that is not converted during the luminescent color conversion becomes thermal energy to cause the phosphors in the phosphor plate 23 (the luminescent color conversion member 10) to generate heat. Accordingly, the temperature of the phosphors is raised and the efficiency of the luminescent color conversion is lowered. Further, the components (including the insulating substrate 21, the LED chips 22, the frame 24, the reflective layer 25) of the light emitting device 20 are deteriorated due to the heat-generation. Accordingly, it is necessary to efficiently dissipate the heat generated by the phosphors. Therefore, when the phosphor plate 23 (the luminescent color conversion member 10) is thinly molded, heat is prevented from being confined in the phosphor plate 23 and the heat generated by the phosphor plate 23 is efficiently dissipated through the LED chip 22 adjacent to the phosphor plate 23. As a result, the temperature rise of the phosphor plate 23 is suppressed and the efficiency decrease of the luminescent color conversion is prevented. Further, the components of the light emitting device 20 are prevented from being deteriorated by the heat generated by the luminescent color conversion member 10, so that it is possible to achieve higher output of the light emitting device 20.

As described above, it is possible to produce a state where a plurality of phosphors 11 are distributed to be overlapped in a thickness direction of the luminescent color conversion member 10 even when the luminescent color conversion member 10 is thinly molded. Accordingly, the scattering of light by at least one of the phosphors 11 or the dispersively binding material 12 occurs inside the luminescent color conversion member 10, so that it is possible to obtain more uniform chromaticity distribution. Therefore, according to the light emitting device 20 including the phosphor plate 23 made of the luminescent color conversion member 10, it is possible to easily achieve both the higher output and the uniform chromaticity distribution.

Light Emitting Device 30—Second Embodiment

Figure 3:
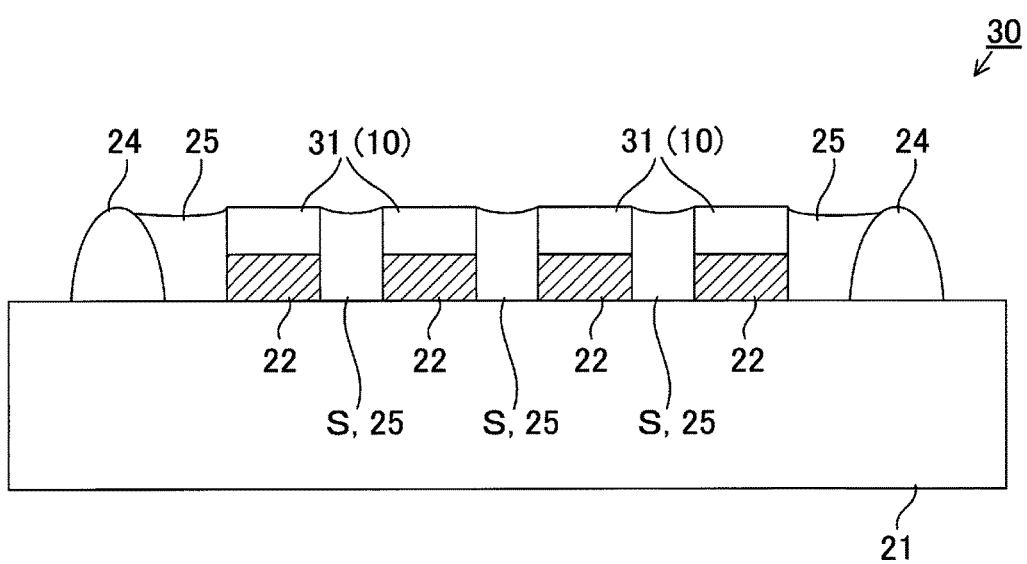
FIG. 3 is a longitudinal sectional view showing a schematic configuration of a light emitting device according to a second embodiment of the present invention.

As shown in FIG. 3, the light emitting device 30 of the second embodiment includes the insulating substrate 21, the LED chip 22, a phosphor plate 31 (the luminescent color conversion member 10), the frame 24, the reflective layer 25 and the like. The light emitting device 30 of the second embodiment is different from the light emitting device 20 of the first embodiment in that one phosphor plate 23 is replaced by four phosphor plates 31.

Each phosphor plate 31 is obtained by forming the luminescent color conversion member 10 into a flat plate. The size and shape of each phosphor plate 31 seen in a plan view are substantially the same as the size and shape of the upper surfaces of each LED chip 22 seen in a plan view. Each phosphor plate 31 is, respectively, fixedly attached to the upper surfaces of each LED chip 22 so as to cover the upper surfaces of each LED chip 22. Similarly to the phosphor plate 23 of the first embodiment, attaching and fixing of each phosphor plate 31 and each LED chip 22 may be performed using any methods.

The light emitting device 30 of the second embodiment can obtain the same advantageous effect as the light emitting device 20 of the first embodiment. Further, in the light emitting device 30, each phosphor plate 31 covers only the upper surfaces of each LED chip 22. Accordingly, the chromaticity of the emission light emitted through each phosphor plate 31 from the upper surfaces of each LED chip 22 can be made to a uniform white light. In addition, since each phosphor plate 31 is provided for each LED chip 22, temperature distribution does not occur in each phosphor plate 31 even when there is a variation in the thickness (height) of each LED chip 22. As a result, there is no possibility that cracks due to the thermal stress occur in each phosphor plate 31.

In contrast, in the light emitting device 20, one phosphor plate 23 also covers the gaps S between respective LED chips 22. Therefore, the light emitted through the phosphor plate 23 from the upper surfaces of each LED chip 22 is a white light whereas the light passing through the gap S from the side surfaces of each LED chip 22 and then emitted through the phosphor plate 23 is a yellow light. Accordingly, there is a possibility that the in-plane distribution of the chromaticity in the surface of the phosphor plate 23 becomes uneven. Further, when there is a variation in the thickness of each LED chip 22, a distance between the upper surfaces of each LED chip 22 and one phosphor plate 23 can be also uneven for each LED chip. Accordingly, temperature distribution occurs in the phosphor plate 23 and there is a possibility that cracks due to the thermal stress occur in the phosphor plate 23.

Light Emitting Device 40—Third Embodiment

Figure 4A:
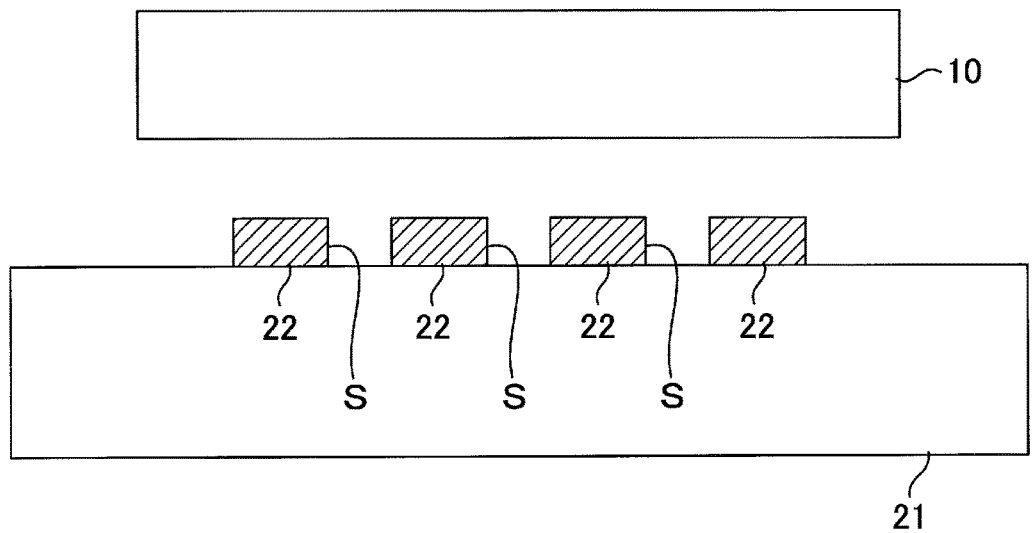
FIGS. 4A and 4B are longitudinal sectional views showing a schematic configuration of a light emitting device according to a third embodiment of the present invention.
Figure 4B:
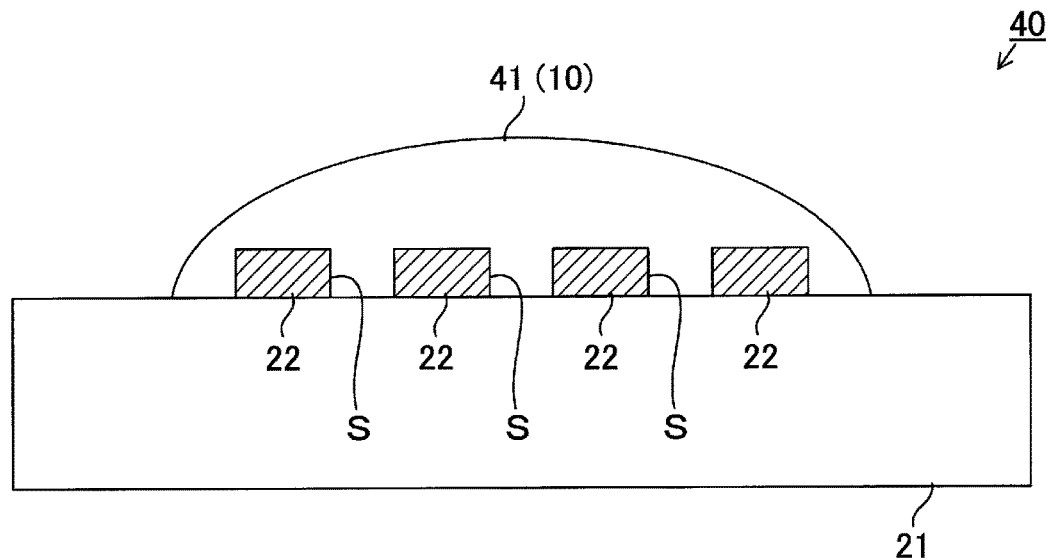

As shown in FIG. 4B, the light emitting device 40 of the third embodiment includes the insulating substrate 21, the LED chip 22, a phosphor layer 41 (the luminescent color conversion member 10) and the like. The light emitting device 40 of the third embodiment is different from the light emitting device 20 of the first embodiment in that the frame 24 and the reflective layer 25 are omitted and the phosphor plate 23 is replaced by the phosphor layer 41.

As shown in FIG. 4A, the luminescent color conversion member 10 formed into a flat plate is opposed to each LED chip mounted on the insulating substrate 21 and a press working is performed while heating the luminescent color conversion member 10. In this way, the upper surfaces and side surfaces of each LED chip 22 are covered by the phosphor layer 41 which is made of the luminescent color conversion member 10 heated and softened. At this time, the luminescent color conversion member 10 heated and softened is excellent in workability. Accordingly, a bullet-shaped (hemispherical) recess is provided in a press plate (not shown) of a press machine, so that the phosphor layer 41 is formed into a bullet shape.

The light emitting device 40 of the third embodiment can obtain the same advantageous effect as the light emitting device 20 of the first embodiment. In addition, since the phosphor layer 41 is formed into a bullet shape, it is possible to impart a function of a collecting lens (convex lens) to the phosphor layer 41.

By the way, in the above illustrative embodiments, the integrated particles 13 are produced by the association and aggregation of the particles of the phosphors 11 and the particles of the dispersively binding material 12. However, since it is difficult to control the association and aggregation state, it is difficult to control the particle size of the integrated particles 13. For this reason, the integrated particles 13 may be produced using the following method. That is, raw materials of the phosphors and the dispersively binding material are mixed and then burnt, thereby producing a integrated body where particulate phosphors and particulate dispersively binding material are mixed to each other. Then, the integrated body is pulverized to produce the integrated particles 13. This method is preferable since the existing techniques for pulverizing the integrated particles 13 can be applied and it is possible to improve productivity. That is, the integrated particles (luminescent color conversion particles) 13 may be particles obtained by the association and aggregation of the particles of the phosphors and the particles of the dispersively binding material, or particles of a sintered body prepared by sintering the phosphors and the dispersively binding material.

While the present invention has been described with reference to certain aspects and embodiments thereof, the scope of the present invention is not limited to the exemplary embodiments described above, and it will be understood by those skilled in the art that various changes and modifications may be made therein without departing from the scope of the present invention as defined by the appended claims.

What is claimed is:

1. A luminescent color conversion member comprising:
a glass; and
integrated particles dispersed inside the glass, each of the integrated particles being a mixture of phosphors and a dispersively binding material that are bonded to each other,
wherein the luminescent color conversion member is configured as a sintered body of a mixture of the integrated particles and glass particles, and
wherein the dispersively binding material is a non-glass material having transparency and bondability to the phosphors.

2. The luminescent color conversion member according to claim 1, wherein the phosphors are garnet-based phosphors and the dispersively binding material is an alumina.

3. The luminescent color conversion member according to claim 1, wherein a particle size of the phosphors is in a range of 1 µm to 7 µm.

4. The luminescent color conversion member according to claim 3, wherein the particle size of the phosphors is substantially equal to a particle size of the dispersively binding material.

5. The luminescent color conversion member according to claim 1, wherein a particle size of the glass particles is equal to or greater than 15 µm.

6. The luminescent color conversion member according to claim 5, wherein a particle size of the integrated particles is substantially equal to the particle size of the glass particles.

7. A light emitting device comprising a light emitting element, and a luminescent color conversion member, wherein the luminescent color conversion member comprises:

a glass; and integrated particles dispersed inside the glass, each of the integrated particles being a mixture of phosphors and a dispersively binding material that are bonded to each other, wherein the luminescent color conversion member is configured as a sintered body of a mixture of the integrated particles and glass particles, and wherein the dispersively binding material is a non-glass material having transparency and bondability to the phosphors.

wherein the luminescent color conversion member is configured and arranged such that primary light and secondary light are mixed to generate a mixed color light and such that the mixed-color light is emitted outside from the luminescent color conversion member, the primary light being excitation light emitted by the light emitting element, and the secondary light being a portion of the primary light that has been color-converted by an excitation of the phosphors contained in the luminescent color conversion member.

* * * * *